United States Patent
Park et al.

(10) Patent No.: US 9,274,372 B2
(45) Date of Patent: Mar. 1, 2016

(54) QUANTUM DOT LIGHT-EMITTING DEVICE AND DISPLAY APPARATUS

(71) Applicant: Samsung Display Co., Ltd., Yongin, Gyeonggi-Do (KR)

(72) Inventors: Jae-Byung Park, Yongin (KR); Jong-Hyuk Kang, Yongin (KR); Hak-Sun Kim, Yongin (KR); Nam-Seok Roh, Yongin (KR); Dong-Hoon Lee, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/457,966

(22) Filed: Aug. 12, 2014

(65) Prior Publication Data

US 2015/0085223 A1    Mar. 26, 2015

(30) Foreign Application Priority Data

Sep. 23, 2013  (KR) .................. 10-2013-0112869

(51) Int. Cl.
*H01J 1/62* (2006.01)
*G02F 1/1335* (2006.01)
*F21V 8/00* (2006.01)
*H01L 33/50* (2010.01)

(52) U.S. Cl.
CPC ........ *G02F 1/133603* (2013.01); *G02B 6/0073* (2013.01); *G02F 2001/133614* (2013.01); *H01L 33/504* (2013.01)

(58) Field of Classification Search
CPC ... H01L 27/322; H01L 33/502; H01L 33/507; H01L 25/0753; H01L 33/50; H01L 33/06; H01L 27/156; C09K 11/7734; G02F 1/133603; G02B 6/0073; F21V 9/10

USPC ..................... 313/498–501; 362/84
See application file for complete search history.

(56) References Cited

U.S. PATENT DOCUMENTS

| | | |
|---|---|---|
| 8,294,156 B2 | 10/2012 | Jang et al. |
| 8,425,803 B2 | 4/2013 | Parce et al. |
| 2007/0262714 A1 | 11/2007 | Bylsma |
| 2008/0094528 A1 | 4/2008 | Robinson et al. |
| 2008/0258160 A1 | 10/2008 | Do |
| 2012/0032151 A1 | 2/2012 | Hama et al. |
| 2012/0154464 A1 | 6/2012 | Ninan et al. |
| 2012/0236587 A1 | 9/2012 | Kim et al. |
| 2012/0250351 A1* | 10/2012 | Shin et al. ............. 362/608 |
| 2012/0274882 A1 | 11/2012 | Jung |
| 2013/0009180 A1 | 1/2013 | Kim et al. |
| 2013/0056706 A1 | 3/2013 | Baxter |

(Continued)

FOREIGN PATENT DOCUMENTS

| | | |
|---|---|---|
| KR | 10-2005-0066844 A | 6/2005 |
| KR | 10-2006-0046707 A | 5/2006 |
| KR | 10-2009-0120733 A | 11/2009 |
| KR | 10-1060233 B1 | 8/2010 |
| KR | 10-2011-0045302 A | 5/2011 |
| KR | 10-2012-0022649 A | 3/2012 |

(Continued)

*Primary Examiner* — Joseph L Williams
(74) *Attorney, Agent, or Firm* — Lee & Morse, P.C.

(57) ABSTRACT

A quantum dot light-emitting device and a display apparatus including the same, the device including a light-emitting device that emits a first light; a quantum dot layer facing the light-emitting device, the quantum dot layer including a plurality of quantum dots, absorbing the first light, and emitting a second light and a third light that have different wavelength ranges compared to the first light; and a band pass filter on the quantum dot layer, the band pass filter cutting off a portion of the second light and a portion of the third light.

21 Claims, 8 Drawing Sheets

(56) References Cited

U.S. PATENT DOCUMENTS

| | | |
|---|---|---|
| 2013/0087821 A1 | 4/2013 | Do et al. |
| 2013/0242543 A1 | 9/2013 | Do et al. |
| 2014/0035960 A1* | 2/2014 | You et al. .................. 345/690 |
| 2014/0078716 A1* | 3/2014 | Ninan et al. ................ 362/84 |
| 2015/0002528 A1* | 1/2015 | Bohn et al. .................. 345/589 |

FOREIGN PATENT DOCUMENTS

| | | |
|---|---|---|
| KR | 10-2012-0098880 A | 9/2012 |
| KR | 10-2012-0122654 A | 11/2012 |
| KR | 10-2012-0135999 A | 12/2012 |
| KR | 10-1244696 B1 | 3/2013 |
| WO | WO-2011-029538 A2 | 10/2011 |

* cited by examiner

QUANTUM DOT LIGHT-EMITTING DEVICE AND DISPLAY APPARATUS

CROSS-REFERENCE TO RELATED APPLICATION

Korean Patent Application No. 10-2013-0112869, filed on Sep. 23, 2013, in the Korean Intellectual Property Office, and entitled: "Quantum Dot Light-Emitting Device and Display Apparatus," is incorporated by reference herein in its entirety.

BACKGROUND

1. Field

Embodiments relate to a quantum dot light-emitting device and a display apparatus.

2. Description of the Related Art

Flat panel display apparatuses may include, e.g., liquid crystal displays (LCDs), plasma display panels (PDPs), and organic light-emitting display apparatuses. LCDs may have advantages of excellent visibility, a simple thin film fabrication technology, low power and less heat emission, and may be used in mobile devices, computer monitors, and TVs.

An LCD is a light-receiving type display apparatus that forms an image by receiving light externally, e.g., not through self-emission. Thus, the LCD may include a backlight unit in a lower part of a liquid crystal display panel, and may display an image by using light emitted from the backlight unit.

A light-emitting diode (LED) that has an excellent effect in saving energy and has fast response speeds may be used as a light source of such a backlight unit. A LED backlight unit may enhance the characteristics of the LCD.

SUMMARY

Embodiments are directed to a quantum dot light-emitting device and a display apparatus.

The embodiments may be realized by providing a quantum dot light-emitting device including a light-emitting device that emits a first light; a quantum dot layer facing the light-emitting device, the quantum dot layer including a plurality of quantum dots, absorbing the first light, and emitting a second light and a third light that have different wavelength ranges compared to the first light; and a band pass filter on the quantum dot layer, the band pass filter cutting off a portion of the second light and a portion of the third light.

The plurality of quantum dots may include a plurality of first quantum dots that absorb the first light and emit the second light, and a plurality of second quantum dots that absorb the first light and emit the third light.

The first quantum dots and the second quantum dots may be formed of a same material and have different sizes.

The third light may have a longer wavelength than the second light, the band pass filter may cut off light in a shortest wavelength region of the second light, and the band pass filter may cut off light in a longest wavelength region of the third light.

A peak wavelength of the second light that passes through the band pass filter may be longer than a peak wavelength of the second light emitted from the quantum dot layer, and a peak wavelength of the third light that passes through the band pass filter may be shorter than a peak wavelength of the third light emitted from the quantum dot layer.

The band pass filter may reflect at least a portion of the first light.

The band pass filter may include a short wave pass filter (SWPF) and a long wave pass filter (LWPF).

A cutoff wavelength of the SWPF may be shorter than or equal to about 655 nm, and a cutoff wavelength of the LWPF may be longer than or equal to about 500 nm.

The first light may be a blue light or an ultraviolet light, the second light may be a green light, and the third light may be a red light.

The plurality of quantum dots may include a core, the core including one of ZnSe, ZnO, ZnTe, InP, GaP, InGaN, or InN.

The plurality of quantum dots may further include a shell surrounding the core, the shell including one of ZnS, ZnSe, GaP, or GaN.

The embodiments may be realized by providing a display apparatus including a backlight unit; and a display panel that receives light from the backlight unit and displays an image, the display panel including a first substrate, a second substrate, and a liquid crystal layer between the first substrate and the second substrate, wherein the backlight unit includes a first region from which a first light is emitted, and a second region from which a second light and a third light are emitted, the second region including a light-emitting device that emits a first light; a quantum dot layer facing the light-emitting device, the quantum dot layer including a plurality of quantum dots, absorbing the first light, and emitting a second light and a third light that have different wavelength ranges compared to the first light; and a band pass filter on the quantum dot layer, the band pass filter cutting off a portion of the second light and a portion of the third light.

The first and second regions of the backlight may be adjacent to one corner of the display panel.

The backlight unit may include a first light guide that transmits the first light from the first region toward the display panel, and a second light guide that transmits the second light and the third light toward the display panel after having passed through the band pass filter.

The display panel may further include a color filter therein, the color filter reproducing a color.

The plurality of quantum dots may include a plurality of first quantum dots that absorb the first light and emit the second light, and a plurality of second quantum dots that absorb the first light and emit the third light.

The third light may have a longer wavelength than the second light, the band pass filter may cut off light in a shortest wavelength region of the second light, and the band pass filter may cut off light in a longest wavelength region of the third light.

The band pass filter may reflect at least a portion of the first light.

The first light may be a blue light or an ultraviolet light, the second light may be a green light, and the third light may be a red light.

The embodiments may be realized by providing a display apparatus including a substrate, the substrate being divided to define a first sub-pixel area for emitting a blue light, a second sub-pixel area for emitting a green light, and a third sub-pixel area for emitting a red light; a pixel electrode on the substrate; an opposite electrode facing the pixel electrode; an intermediate layer between the pixel electrode and the opposite electrode, the intermediate layer including a plurality of quantum dots and emitting and a band pass filter on one of the pixel electrode and the opposite electrode, the one of the pixel electrode and the opposite electrode being adjacent to a side of the apparatus at which light is emitted, wherein the band pass filter overlies the second sub-pixel area and the third sub-pixel area, and cuts off a portion of the green light and a portion of the red light.

The pixel electrode may include a first pixel electrode, a second pixel electrode, and a third pixel electrode, the first pixel electrode overlying the first sub-pixel are, the second pixel electrode overlying the second sub-pixel area, and the third pixel electrode overlying third sub-pixel area, the intermediate layer may include a first intermediate layer, a second intermediate layer, and a third intermediate layer, the first intermediate layer overlying the first sub-pixel area and including a plurality of quantum dots that emit the blue light, the second intermediate layer overlying the second sub-pixel area and including a plurality of quantum dots that emit the green light, and the third intermediate layer overlying third sub-pixel area and including a plurality of quantum dots that emit the red light, the first sub-pixel area may include a first light-emitting device on the substrate, the first light-emitting device including a sequential stack of the first pixel electrode, the first intermediate layer, and the opposite electrode, the second sub-pixel area may include a second light-emitting device on the substrate, the second light-emitting device including a sequential stack of the second pixel electrode, the second intermediate layer, and the opposite electrode, and the third sub-pixel area may include a third light-emitting device on the substrate, the third light-emitting device including a sequential stack of the third pixel electrode, the third intermediate layer, and the opposite electrode, the third pixel electrode.

The display apparatus may further include a color filter on the one of the pixel electrode or the opposite electrode that is adjacent to a side of the apparatus at which light is emitted, the color filter including a first region overlying the first sub-pixel area and through which the blue light passes; a second region overlying the second sub-pixel area and through which the green light passes; and a third region overlying the third sub-pixel area and through which the red light passes; wherein the intermediate layer includes a plurality of quantum dots that emit the blue light, a plurality of quantum dots that emit the green light, and a plurality of quantum dots that emit the red light, and the band pass filter overlies the second region and the third region of the color filter.

The quantum dots that emit the blue light, the quantum dots that emit the green light, and the quantum dots that emit the red light may include a same material as one another and have different sizes from one another.

The band pass filter may cut off light in a shortest wavelength region of the green light, and the band pass filter may cut off light in a longest wavelength region of the red light.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
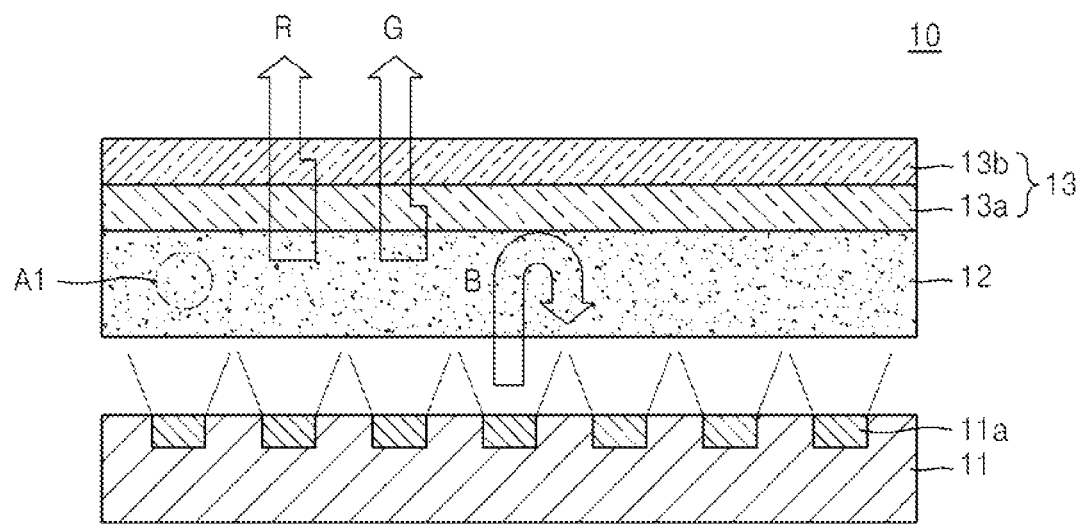
FIG. 1 illustrates a schematic sectional view of a quantum dot light-emitting device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

In the following embodiments, the terms "first" and "second" are used for the purpose of distinguishing one component from another component, not as a limiting meaning.

In the following embodiments, the terms in a singular form may include plural forms unless referred to the contrary.

In the following embodiments, the term "include", "comprise", "has", "including", "comprising", or "having" means that there is a characteristic or component described in the specification and does not exclude that one or more other characteristics or components may be added.

In the following embodiments, when an element such as a film, region, or component is referred to as being "on" another element, it can be directly on another element or intervening elements may also be present.

Expressions such as "at least one of," when preceding a list of elements, modify the entire list of elements and do not modify the individual elements of the list.

Figure 2:
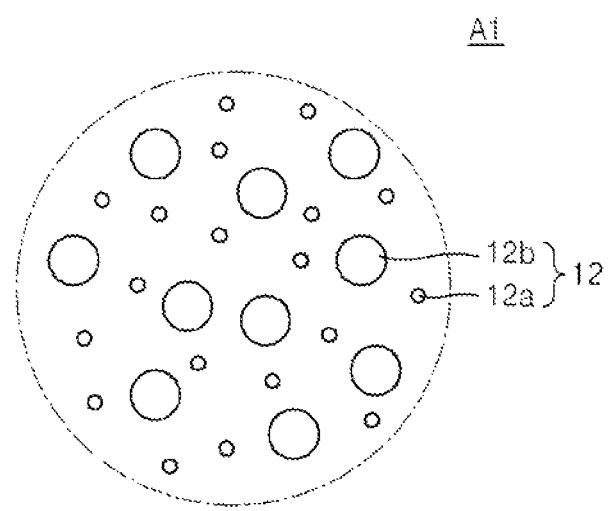
FIG. 2 illustrates an expanded sectional view of part A1 of a quantum dot layer included in the quantum dot light-emitting device of FIG. 1.

FIG. 1 illustrates a schematic sectional view of a quantum dot light-emitting device 10 according to an embodiment, and FIG. 2 illustrates an expanded sectional view of part A1 of a quantum dot layer 12 included in the quantum dot light-emitting device 10 of FIG. 1.

Referring to FIGS. 1 and 2, the quantum dot light-emitting device 10 may include a light-emitting device 11 (that emits a first light), the quantum dot layer 12 on or facing the light-emitting device 11, and a band pass filter 13 on the quantum dot layer 12. The quantum dot layer 12 may include a plurality of quantum dots, e.g., first and second quantum dots 12a and 12b, that absorb the first light and that emit a second light and a third light. The band pass filter 13 may block a portion of the second light and a portion of the third light.

The first light may be light that excites the first and second quantum dots 12a and 12b in the quantum dot layer 12. In an implementation, the first light may be a blue light or an ultraviolet light. The light-emitting device 11 (emitting the first light) may include a plurality of light-emitting diodes (LEDs) 11a (in which current flows in a semiconductor and light is emitted).

The first quantum dots 12a (in the quantum dot layer 12) may absorb the first light and emit the second light. The second quantum dots 12b (in the quantum dot layer 12) may absorb the first light that emit the third light.

A quantum dot is a spherical semiconductor nano material having a size of several nm to several hundred nm. For example, the quantum dot may include a core formed of a material having a small band gap and a shell surrounding the core. Due to a quantum confinement effect, the quantum dot may have discontinuous band gap energy, unlike a bulk state material. Thus, by introducing such a quantum dot into a light-emitting device, it is possible to implement a light-emitting device having high luminance efficiency and color purity.

For example, a quantum dot including cadmium (Cd) (e.g., cadmium selenide (CdSe)), may be suitable for implementing a light-emitting device having high photoluminescence quantum yield and narrow full width at half maximum (FWHM). However, cadmium (Cd) is a heavy metal element that is highly toxic and the Restriction of Hazardous Substances (RoHS) rule inhibits the usage of cadmium (Cd). Accordingly, a light-emitting device using a more environmentally friendly quantum dot may be desirable.

Thus, a quantum dot light-emitting device according to an embodiment may include environmentally friendly quantum dots, e.g., the first and second quantum dots 12a and 12b, which do not include a toxic heavy metal material, such as cadmium (Cd) or mercury (Hg). In an implementation, the first and second quantum dots 12a and 12b may include a core that includes, e.g., one of ZnSe, ZnO, ZnTe, InP, GaP, InGaN, or InN.

The first and second quantum dots 12a and 12b may further include a shell that surrounds the core and protects the core, thereby increasing fluorescence and stability of the first and second quantum dots 12a and 12b. In an implementation, the shell may include, e.g., one of ZnS, ZnSe, GaP, or GaN As noted above, the first quantum dots 12a may absorb the first light and may emit the second light. The second light may be, e.g., green light. The second quantum dots 12b may absorb the first light and may emit the third light. The third light may be, e.g., red light. In an implementation, the first quantum dots 12a and the second quantum dots 12b may be formed of the same material and may have different sizes. In an implementation, the first quantum dot 12a and the second quantum dot 12b may be formed of different materials.

For example, a quantum dot may have a characteristic an the interval between energy bands varies depending on a size of the quantum dot. As a result, even if the same quantum dots (e.g., quantum dots formed of the same material) are used, it is possible to emit light having different wavelengths when the size of the quantum dots is different. The smaller the quantum dot is in size, the larger its energy band gap may be Thus, the wavelength of an emitted light may be shortened.

In an implementation, first quantum dots 12a (that emit the second light) may be smaller in size than the second quantum dots 12b (that emit the third light). For example, the third light may have a longer wavelength than the second light. In an implementation, the second light may be green light (of which a central wavelength thereof is about 530±5 nm and of which the FWHM is about 40 to 60 nm), and the third light may be red light (of which a central wavelength thereof is about 625±5 nm and of which the FWHM is about 40 to 60 nm).

Figure 3:
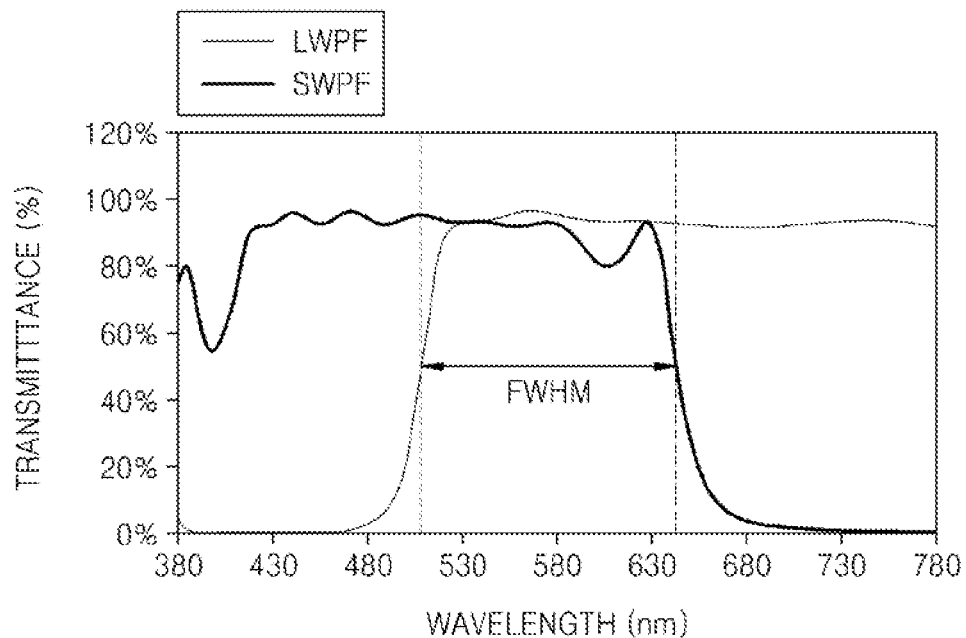
FIG. 3 illustrates a graph of a transmission spectrum of a band pass filter included in the quantum dot light-emitting device of FIG. 1.
Figure 4:
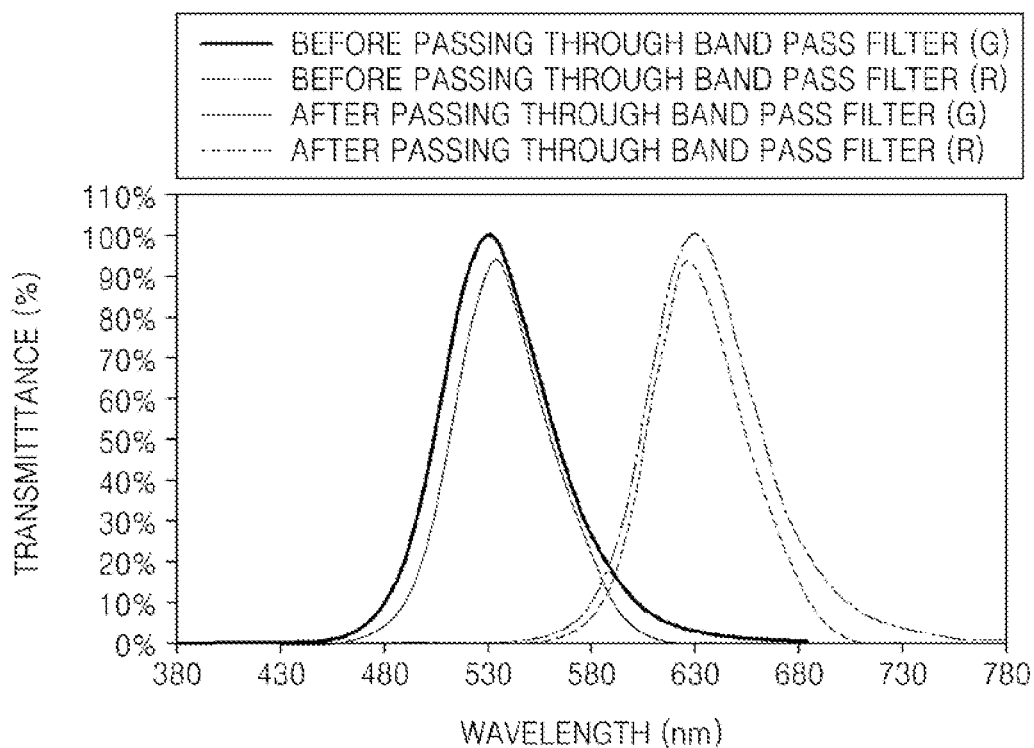
FIG. 4 illustrates a graph of spectra of lights before and after passing through the band pass filter of FIG. 3, after being emitted from the quantum dot layer of the quantum dot light-emitting device of FIG. 1.

The band pass filter 13 may be on the quantum dot layer 12. The band pass filter 13 may transmit a portion of the second light and a portion of the third light, and may reflect or absorb remaining portions of the second light and the third light. By including the band pass filter 13, the quantum dot light-emitting device 10 according to an embodiment may help enhance the characteristics of the environmentally friendly quantum dots, e.g., the first and second quantum dots 12a and 12b (which may not exhibit as good a photoluminescence quantum yield or a FWHM, compared to a quantum dot including cadmium (Cd)). A detailed configuration of the band pass filter 13 may be as follows:

FIG. 3 illustrates a graph of a transmission spectrum of the band pass filter 13 included in the quantum dot light-emitting device 10 of FIG. 1, and FIG. 4 illustrates a graph of spectra of lights before and after passing through the band pass filter 13 of FIG. 3, after being emitted from the quantum dot layer 12 of the quantum dot light-emitting device 10 of FIG. 1.

Referring to FIGS. 1 and 3, the band pass filter 13 of the quantum dot light-emitting device 10 according to an embodiment may include a long wave pass filter (LWPF) 13a and a short wave pass filter (SWPF) 13b.

The LWPF 13a and the SWPF 13b may have structures in which a high refraction layer and a low refraction layer are alternately stacked. In an implementation, a cutoff wavelength of the LWPF 13a may be equal to or longer than about 500 nm (e.g., about 500 nm or longer), and a cutoff wavelength of the SWPF 13b may be shorter than or equal to about 655 nm (e.g., about 655 nm or shorter).

Referring back to FIG. 1, in an implementation, a short wavelength range of a green light may be cut off by the LWPF 13a, a long wavelength range of a red light may be cut off by the SWPF 13b, and a blue light (e.g., all blue light in a blue wavelength range) may be cut off, e.g., reflected or absorbed by the LWPF 13a. For example, a portion of the green light (e.g., second light) having a relatively shorter wavelength may be cut off by the LWPF 13a, and a portion of the red light (e.g., third light) having a relatively longer wavelength may be cut off by the SWPF 13b. For example, the band pass filter may cut off light in a shortest wavelength region of the second light and may cut off light in a longest wavelength region of the third light.

In the description above, FWHM refers to a maximum difference of two points corresponding to a location that has ½ of a maximum transmittance, at the transmission spectrum of the band pass filter 13. The cutoff wavelength refers to a wavelength value corresponding to a place that has ½ of maximum transmittance, at the transmission spectrum of the band pass filter.

In FIG. 4, spectra of second and third lights before passing through the band pass filter 13 of FIG. 3 (after being emitted from the quantum dot layer 12 according to the present embodiment) are compared with spectra of second and third lights (after being emitted from the quantum dot layer 12 according to the present embodiment and then passing through the band pass filter 13 of FIG. 3).

The band pass filter 13 may transmit light of a longer or longest wavelength range of the second light, and may transmit light of a shorter or shortest wavelength range of the third light. For example, the band pass filter 13 may cut off light of a relatively shorter wavelength range (e.g., a shortest wavelength region) of the second light, and may cut off light of a relatively longer wavelength range (e.g., a longest wavelength region) of the third light. As a result, the FWHM of the second light and the third light may be narrowed.

Referring to FIG. 4, a peak wavelength of the second light that is transmitted through the band pass filter 13 may be longer than that of the second light that is emitted from the quantum dot layer 12 (e.g., prior to passing through the band pass filter 13). A peak wavelength of the third light that is transmitted through the band pass filter 13 may be shorter than that of the third light that is emitted from the quantum dot layer 12 (e.g., prior to passing through the band pass filter 13).

For example, the FWHM of the second light and the third light that are emitted from the quantum dot layer 12 may narrow, and peak wavelengths may shift.

In addition, the cutoff wavelength of the LWPF 13a (included in the band pass filter 13) may be equal to or longer than about 500 nm, and at least a portion of a first light having a wavelength shorter than a green light, e.g., a blue light or an ultraviolet light, may be reflected by the band pass filter 13.

The portion of the first light that is reflected by the band pass filter 13 may re-enter the quantum dot layer 12, the first light having re-entered the quantum dot layer 12 may excite the quantum dots 12a and 12b, and the quantum dot layer 12 may re-emit the second light and the third light by using the re-entered blue or first light.

For example, the first (e.g., blue) light may be reflected (and not transmitted) by the band pass filter 13, and may repetitively enters the quantum dot layer 12, and it is possible to enhance the luminance efficiency of the quantum dot light-emitting device 10 according to an embodiment.

Figure 5:
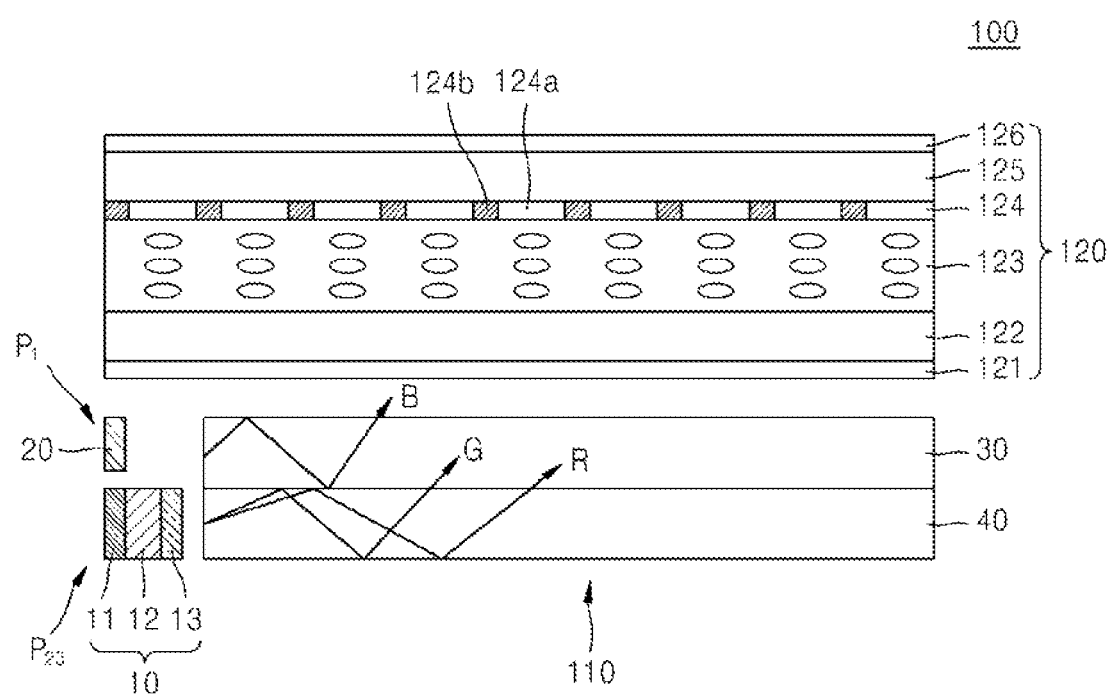
FIG. 5 illustrates a schematic sectional view of a display apparatus according to an embodiment.

FIG. 5 illustrates a schematic sectional view of a display apparatus 100 according to an embodiment.

Referring to FIG. 5, the display apparatus 100 according to an embodiment may include a backlight unit 110 and a display panel 120 (that receives lights from the backlight unit 110). The display panel 120 may display an image, and may include a first substrate 122, a second substrate 125, and a liquid crystal layer 123 between the first substrate 122 and the second substrate 125.

The backlight unit 110 may include a first region P1 (that emits a first light) and a second region P23 (that emits a second light and a third light). The second region P23 (that emits the second light and the third light) may include the quantum dot light-emitting device 10 of FIG. 1. The quantum dot light-emitting device 10 may include a light-emitting device 11 (that emits a first light), a quantum dot layer 12 (that includes a plurality of quantum dots, absorbs the first light, and emits the second light and the third light that have different wavelength range from the first light), and a band pass filter 13 (that is on the quantum dot layer 12 and that cuts off a portion of the second light and a portion of the third light.)

The first region P1 (that emits the first light) and the second region P23 (that emits the second light and the third light) may be arranged on regions corresponding to one corner of the display panel 120. For example, the first region P1 and the second region P23 may be adjacent to a corner of the display panel 120. The backlight unit 110 may further include a first light guide 30 (that transmits the first light emitted to or toward the display panel 120) and a second light guide 40 (that transmits the second light and the third light to or toward the display panel 120, e.g., by way of the first light guide The first region P1 (that emits the first light) may include a light-emitting diode package 20 including a plurality of light-emitting diodes (LEDs) that emit the first light. The second region P23 (that emits the second light and the third light) may include the quantum dot light-emitting device 10 of FIG. 1 as described above.

The first light guide 30 and the second light guide 40 may be arranged under the display panel 120. Edges of the first light guide 30 and the second light guide 40 may face the first region P1 (that emits the first light) and second region P23 (that emits the second light and the third light), e.g., respectively.

The first light may be transmitted to the display panel 120 through the first light guide 30. The second light and the third light may be transmitted to or toward the display panel 120 through the second light guide 40 (e.g., and then through the first light guide 30). The first to third lights may correspond to or may be a blue light, a green light, and a red light, respectively. The backlight unit 110 according to the present embodiment may make or provide a white light by a combination of the first to third lights.

The quantum dot layer 12 of the quantum dot light-emitting device 10 may include a plurality of first quantum dots (12a in FIG. 2) that absorb the first light and that emit the second light, and a plurality of second quantum dots (12b in FIG. 2) that absorb the first light and that emit the third light. The band pass filter 13 may cut off a portion of light of a relatively shorter wavelength range (e.g., a shortest wavelength region) from the second light, and may cut off a portion of light of a relatively longer wavelength range (e.g., a longest wavelength region) from the third light, and may decrease the FWHM of the second and third lights.

In addition, the band pass filter 13 may reflect at least a portion of the first light, the reflected first light may re-enter the quantum dot layer 12, and it is possible to recycle the reflected first light and thus enhance the luminance efficiency of the quantum dot light-emitting device 10. Related detailed descriptions are provided above and thus may be omitted.

The display panel 120 may include a first substrate 122, a second substrate 125, and a liquid crystal layer 123 between the first substrate 122 and the second substrate 125. The first substrate 122 may include wirings and devices, e.g., thin film transistors (TFTs) (not shown). A first electrode (not shown) may be on the first substrate 122.

In order to realize colors, a color filter layer 124 may be on a surface of the second substrate 125, on which the liquid crystal layer 123 is arranged. The color filter layer 124 may include, e.g., a color filter 124a and a black matrix 124b (that separates the color filter 124a from another color filter 124a).

In addition, a second electrode (not shown) may be on a surface of the color filter layer 124, on which the liquid crystal layer 123 is arranged.

The display apparatus 100 according to the present embodiment may allow current to flow between the first electrode (not shown) and the second electrode (not shown), and may control the on/off of a light emitted according to the alignment of liquid crystals according to the on/off of currents.

The color filter layer 124 may include, e.g., a region that transmits a blue light, a region that transmits a green light, and a region that transmits a red light, and may realize colors on the display apparatus 100 by using transmitted lights.

Polarizing plates 121 and 126 may be respectively arranged on outer surfaces of the first substrate 122 and the second substrate 125, and various optical sheets (not shown) may be arranged between the backlight unit 110 and the display panel 120.

Figure 6:
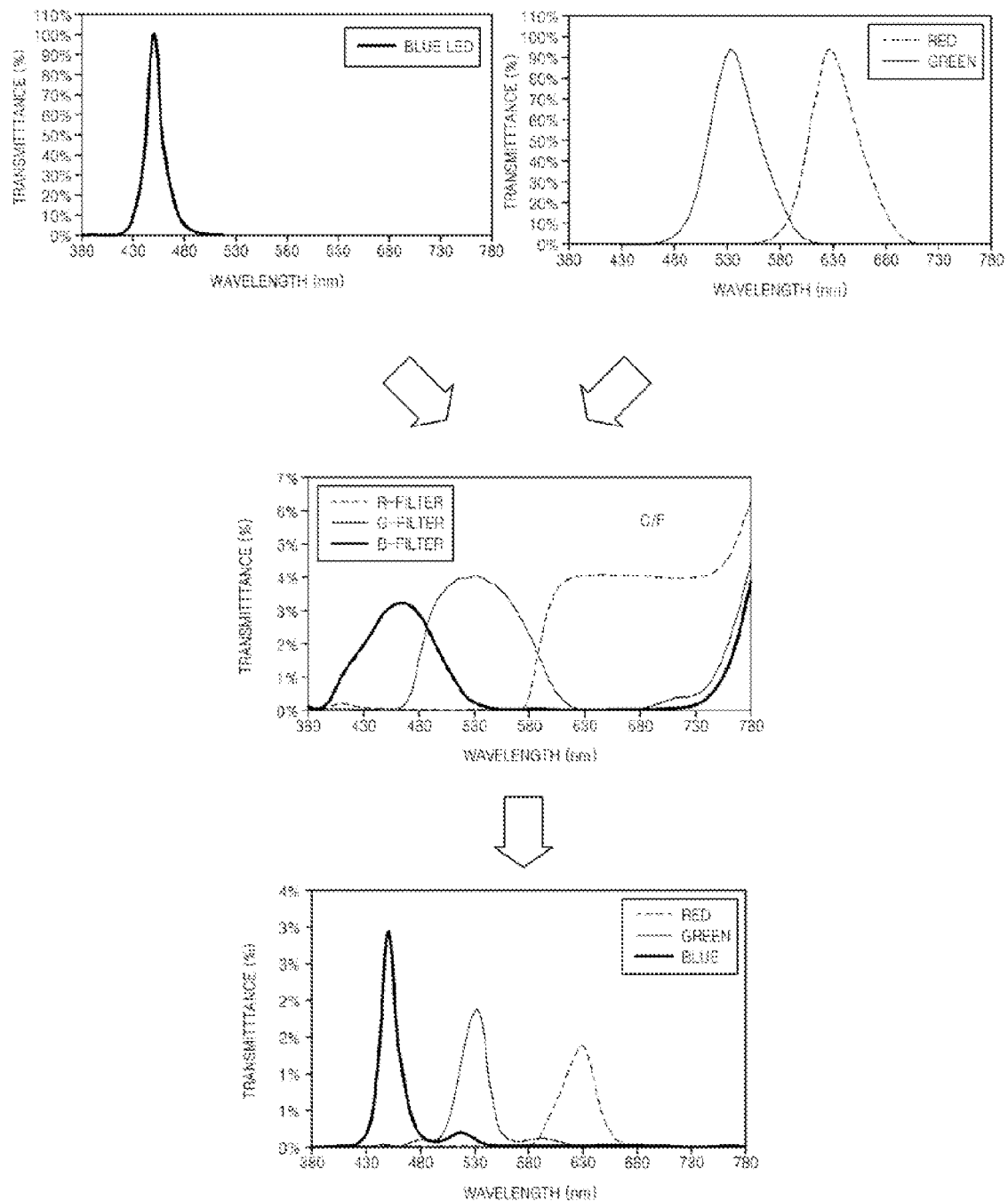
FIG. 6 illustrates a graph of spectra before and after light emitted from a backlight unit included in the display apparatus of FIG. 5 passes through a color filter.
Figure 7:
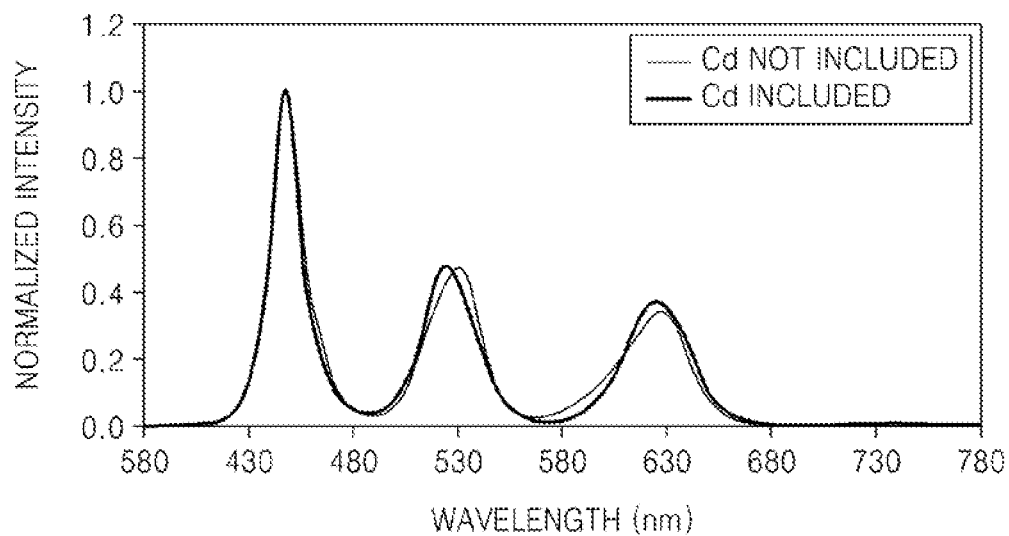
FIG. 7 illustrates a graph comparing a spectrum after light emitted from the backlight unit of the display apparatus of FIG. 5 passes through a color filter, with a spectrum after light emitted from a backlight unit (that includes cadmium (Cd)) passes through the color filter.

FIG. 6 illustrates a graph of spectra before and after light emitted from a backlight unit included in the display apparatus 100 of FIG. 5 passes through a color filter. FIG. 7 illustrates a graph comparing a spectrum after light emitted from the backlight unit 110 included in the display apparatus 100 of FIG. 5 passes through a color filter, with a spectrum after light emitted from another backlight unit (that includes cadmium (Cd)) passes through a color filter.

Referring to FIG. 6, a first light Blue (that is emitted from the first region P1 of the backlight unit 110 of FIG. 5), a second light Green and a third light Red (that are emitted from the quantum dot light-emitting device 10 included the second region P23) may enter a color filter C/F.

The graph at the center of FIG. 6 represents a transmission spectrum of the color filter C/F itself, and the color filter C/F may have a transmittance of the color filter itself for a blue light, a green light, and a red light.

The first to third lights (that have entered the color filter) may pass through the color filter and then may have spectra corresponding to the lowest or bottom graph of FIG. 6.

FIG. 7 illustrates a graph that compares intensities of a blue light, a green light, and a red light according to a wavelength (after lights emitted from the quantum dot light-emitting device 10 according to an embodiment pass through a color filter) with intensities of blue light, green light, and red light according to wavelength (after lights emitted from a quantum dot light-emitting device that includes cadmium (Cd) pass through a color filter).

For example, the quantum dot light-emitting device 10 according to an embodiment may include environmentally friendly quantum dots, e.g., without a toxic material such as cadmium (Cd), and may include the band pass filter 13 in order to help improve the characteristics of the environmentally friendly quantum dots. In FIG. 7, it may be seen that the quantum dot light-emitting device 10 according to the present embodiment may have similar characteristics to the other quantum dot light-emitting device that includes cadmium (Cd).

Figure 8:
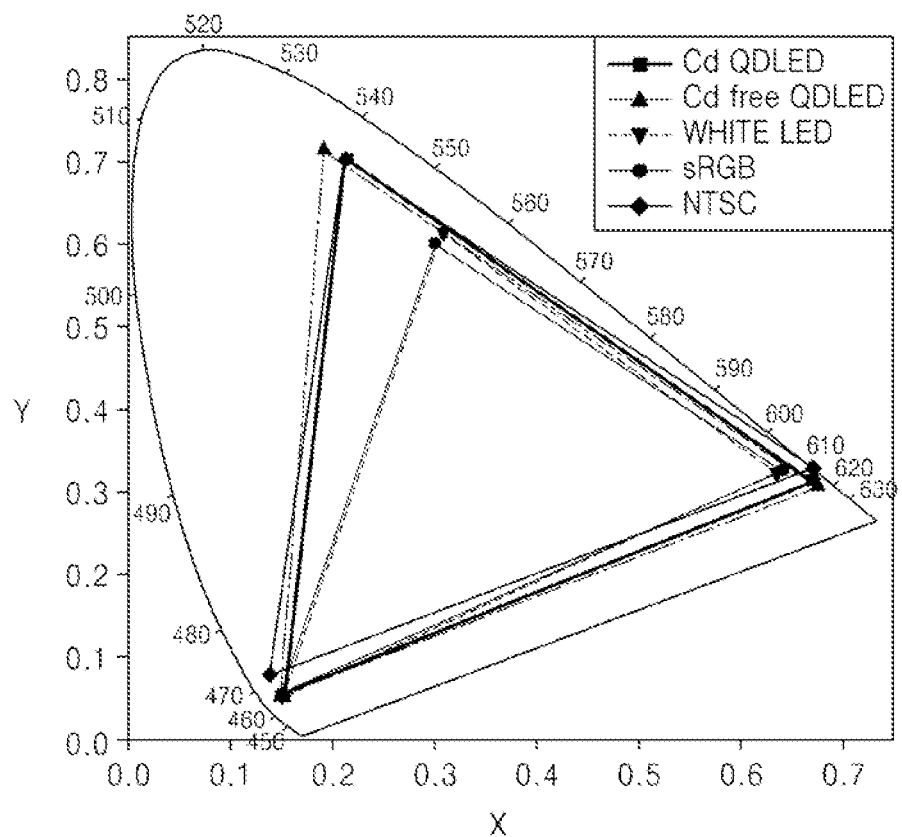
FIG. 8 illustrates a graph of a color reproduction range of the quantum dot light-emitting device of FIG. 1.

FIG. 8 illustrates a graph of a color reproduction range of the quantum dot light-emitting device 10 of FIG. 1. Table 1, below, represents color reproduction ratios of a quantum dot light-emitting device that includes cadmium (Cd) and the quantum dot light-emitting device 10 (e.g., according to an embodiment and free of cadmium (Cd)) of FIG. 1 and sRGB gamut match ratios.

TABLE 1

| C.I.E 1931 | Cd QDLED | | Cd free QDLED | |
|---|---|---|---|---|
| | x | y | x | y |
| Red | 0.674 | 0.309 | 0.668 | 0.315 |
| Green | 0.191 | 0.715 | 0.213 | 0.702 |
| Blue | 0.151 | 0.056 | 0.151 | 0.053 |
| Basic | NTSC | sRGB | NTSC | sRGB |
| Gamut | 105.9% | 149.5% | 101.0% | 142.6% |
| Gamut | NTSC | sRGB | NTSC | sRGB |
| Match ratio | 94.9% | 100.0% | 93.5% | 100.0% |

Referring to FIG. 8 and Table 1, the color reproduction ratios of the lights emitted from the quantum dot light-emitting device that includes cadmium (Cd) and the quantum dot light-emitting device 10 of FIG. 1 (not including cadmium (Cd) and including the band pass filter 13) may be significantly or substantially similar to each other. For example, in a match ratio with respect to sRGB, two cases both were 100%, and in a match ratio with respect to NTSC, the case including cadmium (Cd) was 94.9% and the case not including cadmium (Cd) was 93.5%.

For example, it may be seen that the quantum dot light-emitting device 10 of FIG. 1 according to an embodiment had similar characteristics to a light-emitting device including cadmium (Cd), even in terms of a color reproduction ratio.

Figure 9:
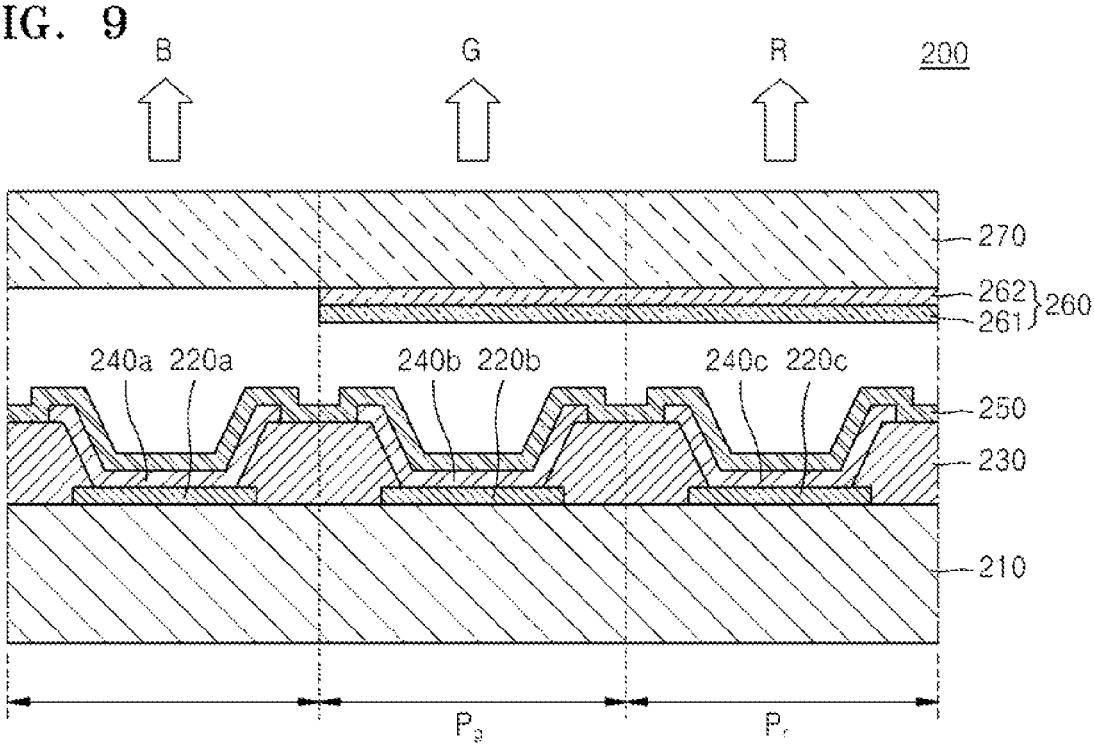
FIG. 9 illustrates a schematic sectional view of a display apparatus according to another embodiment.

FIG. 9 illustrates a schematic sectional view of a display apparatus 200 according to another embodiment.

Referring to FIG. 9, the display apparatus 200 according to the present embodiment may include a substrate 210 that is divided into and/or defines a first sub-pixel area Pb, a second sub-pixel area Pg, and a third sub-pixel area Pr at which a blue light B, a green light G, and a red light B are emitted, respectively. The first sub-pixel area Pb may include a first light-emitting device thereon that includes a sequentially stacked first pixel electrode 220a, first intermediate layer 240a (including a plurality of quantum dots that emit a blue light), and opposite electrode 250 on the substrate 210. The second sub-pixel area Pg may include a second light-emitting device thereon that includes a sequentially stacked second pixel electrode 220b, second intermediate layer 240b (including a plurality of quantum dots that emit a green light), and opposite electrode 250 on the substrate 210. The third sub-pixel area Pr may include a third light-emitting device thereon that includes a sequentially stacked third pixel electrode 220c, third intermediate layer 240c (including a plurality of quantum dots that emit a red light), and opposite electrode 250 on the substrate 210.

Each sub-pixel area may be divided by a pixel-defining layer 230, and an encapsulation substrate 270 (that protects the first to third light-emitting devices) may be arranged on the opposite electrode 250.

In an implementation, the first pixel electrode 220a, the second pixel electrode 220b, and the third pixel electrode 220c may be reflective electrodes, and the opposite electrode 250 may be a transparent or translucent electrode.

For example, the display apparatus 200 according to the present embodiment may be a top emission type, in which a light may be emitted toward the opposite electrode 250.

The first intermediate layer 240a, the second intermediate layer 240b, and the third intermediate layer 240c may include a plurality of quantum dots that emit a blue light, a green light, and a red light, respectively. In an implementation, in addition to a quantum dot layer, the intermediate layers 240a, 240b, 240c may further include at least one of a hole injection layer (HIL), a hole transport layer (HTL), an electron transport layer (ETL), and an electron injection layer (EIL).

The display apparatus 200 according to the present embodiment may be a self-emitting type display apparatus in which excitons that are generated when holes injected from the first to third pixel electrodes 220a to 220c and electrons injected from the opposite electrode 250 are combined at the quantum dot layer and generate a light while dropping from an excited state to a ground state.

As described above, a quantum dot may have a discontinuous energy band by a quantum confinement effect, the display apparatus 200 according to the present embodiment may emit lights having high luminance efficiency and color purity.

The quantum dots included in the first to third intermediate layers 240a to 240c according to the present embodiment may be formed of the same material and may have different sizes. For example, the quantum dot included in the first intermediate layer 240a may be the smallest, and the quantum dot included in the third intermediate layer 240c may be the largest.

The quantum dots may be environmentally friendly quantum dots that do not include a toxic heavy metal material, e.g., cadmium (Cd) or mercury (Hg). In an implementation, the quantum dots may include a core that includes, e.g., one of ZnSe, ZnO, ZnTe, InP, GaP, InGaN, or InN. In an implementation, the quantum dots may include a shell that includes, e.g., one of ZnS, ZnSe, GaP, or GaN.

The display apparatus 200 according to the present embodiment may include, on the opposite electrode 250, a band pass filter 260 that cuts off a portion of a green light and a portion of a red light. The band pass filter 260 may be arranged on an inner region of the encapsulation substrate 270 corresponding to or overlying the second sub-pixel area Pg and the third sub-pixel area Pr.

The band pass filter 260 according to the present embodiment may be arranged to be common to, e.g., may continuously overlie, the second sub-pixel area Pg and the third sub-pixel area Pr. The band pass filter 260 may include an LWPF 261 and an SWPF 262.

According to the configuration above, the display apparatus 200 may include as a light-emitting layer that is an environmentally friendly quantum dot layer (e.g., that does not include cadmium (Cd)), and may decrease the FWHM of a green light G and a red light R using the band pass filter 260, thereby increasing color purity.

Figure 10:
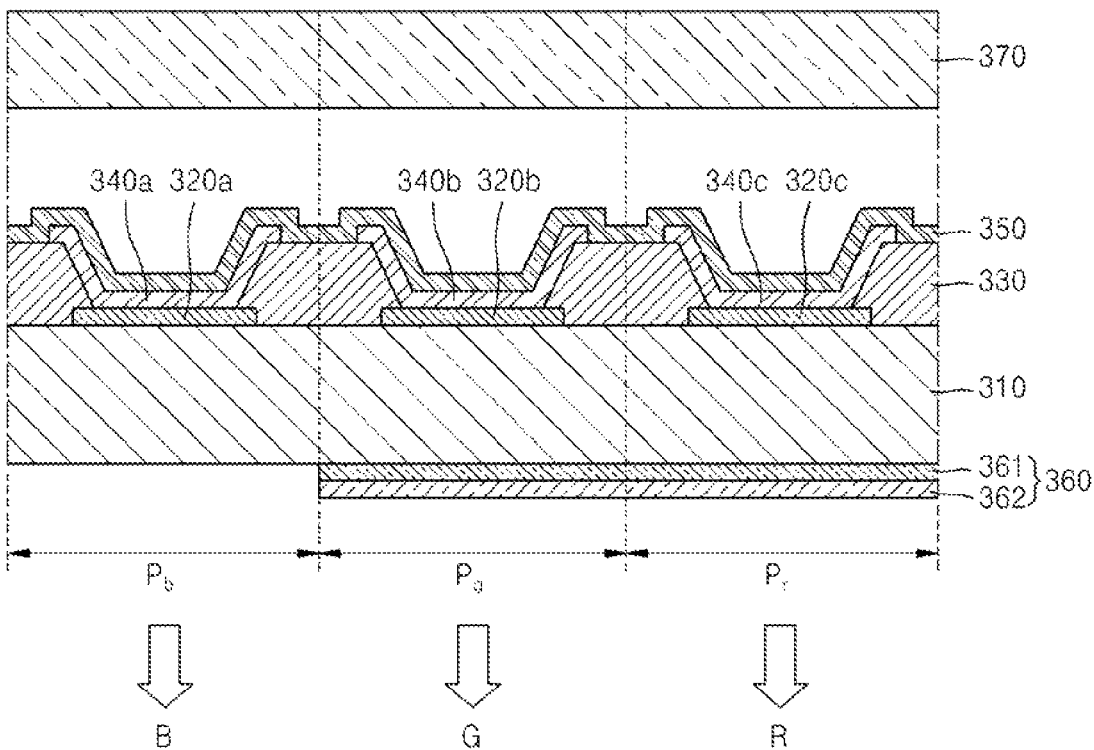
FIG. 10 illustrates a schematic sectional view of a display apparatus according to another embodiment.

FIG. 10 illustrates a schematic sectional view of a display apparatus 300 according to another embodiment.

Referring to FIG. 10, the display apparatus 300 according to the present embodiment may include a substrate 310 that is divided into and/or defines a first sub-pixel area Pb, a second sub-pixel area Pg, and a third sub-pixel area Pr at which a blue light, a green light, and a red light are emitted, respectively. The first sub-pixel area Pb may include a first light-emitting device thereon that includes a sequentially stacked first pixel electrode 320a, first intermediate layer 340a including a plurality of quantum dots that emit a blue light, and opposite electrode 350 on the substrate 310. The second sub-pixel area Pg may include a second light-emitting device thereon that includes a sequentially stacked second pixel electrode 320b, second intermediate layer 340b including a plurality of quantum dots that emit a green light, and opposite electrode 250 on the substrate 310. The third sub-pixel area Pr may include a third light-emitting device thereon that includes a sequentially stacked third pixel electrode 320c, a third intermediate layer 340c including a plurality of quantum dots that emit a red light, and opposite electrode 350 on the substrate 310.

Each sub-pixel area may be divided by a pixel-defining layer 330, and an encapsulation substrate 370 (that protects the first to third light-emitting devices) may be on the opposite electrode 350.

In an implementation, the first pixel electrode 320a, the second pixel electrode 320b, and the third pixel electrode 320c may be transparent or translucent electrodes, and the opposite electrode 350 may be a reflective electrode.

For example, the display apparatus 300 according to the present embodiment may be a bottom emission type, in which a light is emitted toward the first to third pixel electrodes 320a to 320c.

The first intermediate layer 340a, the second intermediate layer 340b, and the third intermediate layer 340c may include a plurality of quantum dots that emit a blue light, a green light, and a red light, respectively. The quantum dots may be formed of the same material and may have different sizes. For example, the quantum dot included in the first intermediate layer 340a may be the smallest, and the quantum dot included in the third intermediate layer 340c may be the largest.

The quantum dots may be environmentally friendly quantum dots that do not include a toxic heavy metal material, e.g., cadmium (Cd) or mercury (Hg). The quantum dots may include a core that includes, e.g., one of ZnSe, ZnO, ZnTe, InP, GaP, InGaN, or InN. The quantum dots may include a shell that includes, e.g., one of ZnS, ZnSe, GaP, or GaN.

The display apparatus 300 according to the present embodiment may include a band pass filter 360 that cuts off a portion of a green light and a portion of a red light. In an implementation, the band pass filter 360 may be arranged only on outer regions of the substrate 310 corresponding to or overlying the second sub-pixel area Pg and the third sub-pixel area Pr. In an implementation, the band pass filter 360 may also be arranged between the second and the third pixel electrodes 320b and 320c and the substrate 310.

The band pass filter 360 according to the present embodiment may be arranged to be common to, e.g., may continuously overlie, the second sub-pixel area Pg and the third sub-pixel area Pr. The band pass filter 360 may include an LWPF 361 and an SWPF 362.

Figure 11:
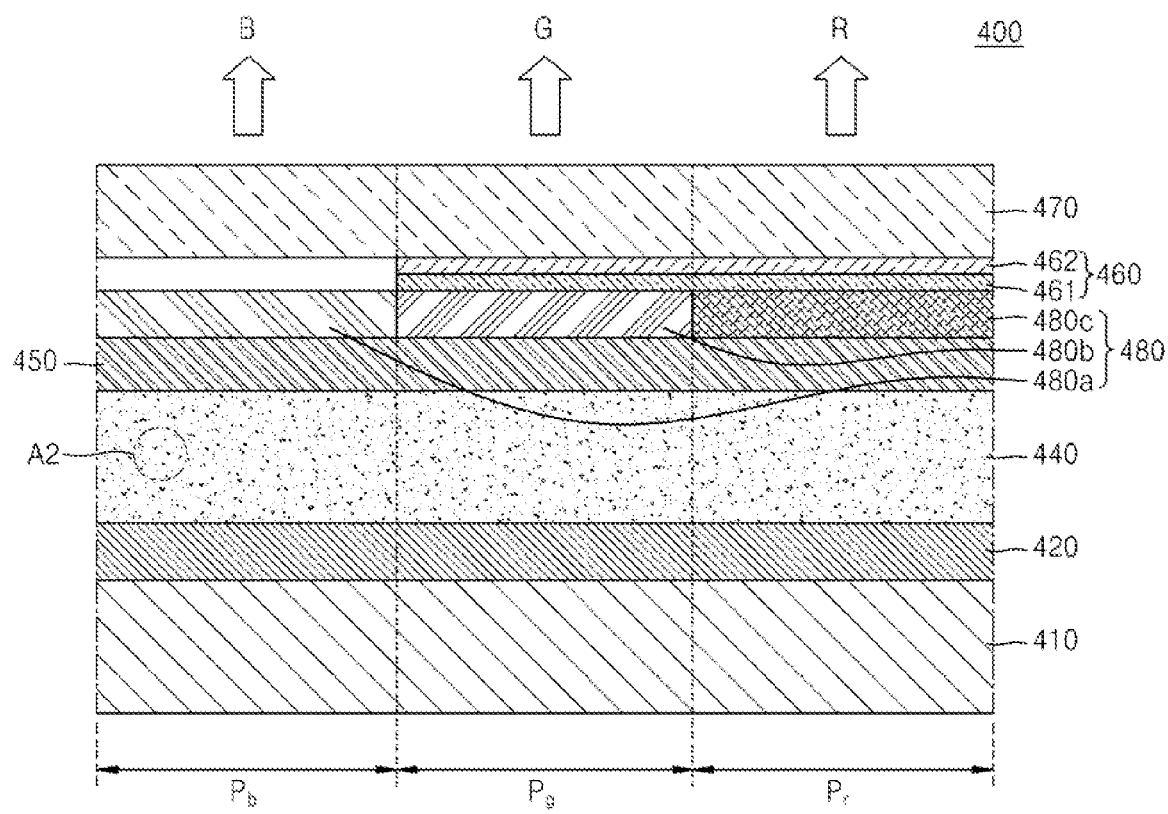
FIG. 11 illustrates a schematic sectional view of a display apparatus according to another embodiment.
Figure 12:
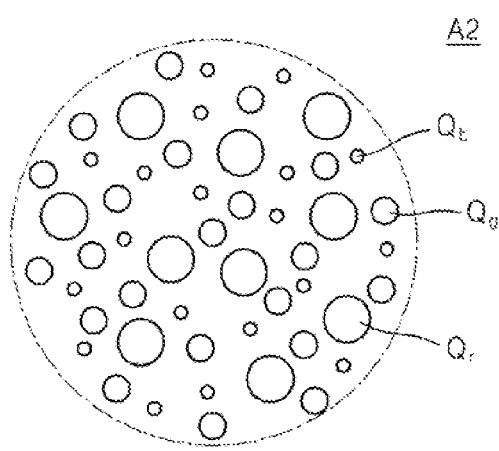
FIG. 12 illustrates an expanded sectional view of part A2 of an intermediate layer included in the display apparatus of FIG. 11.

FIG. 11 illustrates a schematic sectional view of a display apparatus 400 according to another embodiment, and FIG. 12 illustrates an expanded sectional view of part A2 of an intermediate layer 440 included in the display apparatus 400 of FIG. 11.

Referring to FIGS. 11 and 12, the display apparatus 400 according to the present embodiment may include a substrate 410 (that is divided into or defines a first sub-pixel area Pb, a second sub-pixel area Pg, and a third sub-pixel area Pr at which a blue light B, a green light G, and a red light R are emitted, respectively). The display apparatus 400 may include a pixel electrode 420, an intermediate layer 440 (that includes a plurality of quantum dots and that emits lights), and an opposite electrode 450 that are sequentially stacked on the substrate 410.

The pixel electrode 420 may be a reflective electrode, and the opposite electrode 450 may be a transparent or translucent electrode.

For example, the display apparatus 400 according to the present embodiment may be a top emission type in which a light is emitted toward the opposite electrode 450.

The intermediate layer 440 may include a plurality of quantum dots Qb that emit a blue light, a plurality of quantum dots Qg that emit a green light, and a plurality of quantum dots Qr that emit a red light. In an implementation, in addition to the quantum dots Qb, Qg, and Qr, the intermediate layer 440 may further include at least one of an HIL, an HTL, an ETL, or an EIL. The quantum dots Qb, Qg, and Qr may be formed of the same material and may have different sizes, according to the wavelength of an emitted light. In addition, the quantum dots Qb, Qg, and Qr may not include a heavy metal, e.g., cadmium (Cd).

The display apparatus 400 according to the present embodiment may emit a light when excitons drop from an excited state to a ground state. The excitons may be generated by combining holes injected from the pixel electrode 420 and electrons injected from the opposite electrode 250 in a quantum dot layer that includes the quantum dots Qb, Qg, and Qr. For example, the intermediate layer 440 may emit a white light.

A color filter 480 (for reproducing a color on the display apparatus 400) may be included on the opposite electrode 430. The color filter 480 may include a first region 480a (overlying the first sub-pixel area Pb and transmitting a blue light), a second region 480b (overlying the second sub-pixel area Pg and transmitting a green light), and a third region 480c (overlying the third sub-pixel area Pr and transmitting a red light).

A band pass filter 460 may be included on regions of the color filter 480 corresponding to or overlying the second sub-pixel area Pg and the third sub-pixel area Pr, e.g., on or overlying the second region 480b and the third region 480c of the color filter 480.

The band pass filter 460 according to the present embodiment may be arranged to be common to, e.g., may continuously overlie, the second sub-pixel area Pg and the third sub-pixel area Pr. The band pass filter 460 may include an LWPF 461 and an SWPF 462. The band pass filter 460 may reflect or absorb portions of a green light and a red light emitted from the intermediate layer 440 to decrease the FWHM of the green light and the red light that is externally emitted, thereby enhancing the color purity of the display apparatus 400.

An encapsulation substrate 470 may be on the band pass filter 460.

In an implementation, the band pass filter 460 is between the encapsulation substrate 470 and the color filter 480. In an implementation, the band pass filter 460 may be on an outer surface of the encapsulation substrate 470.

Figure 13:
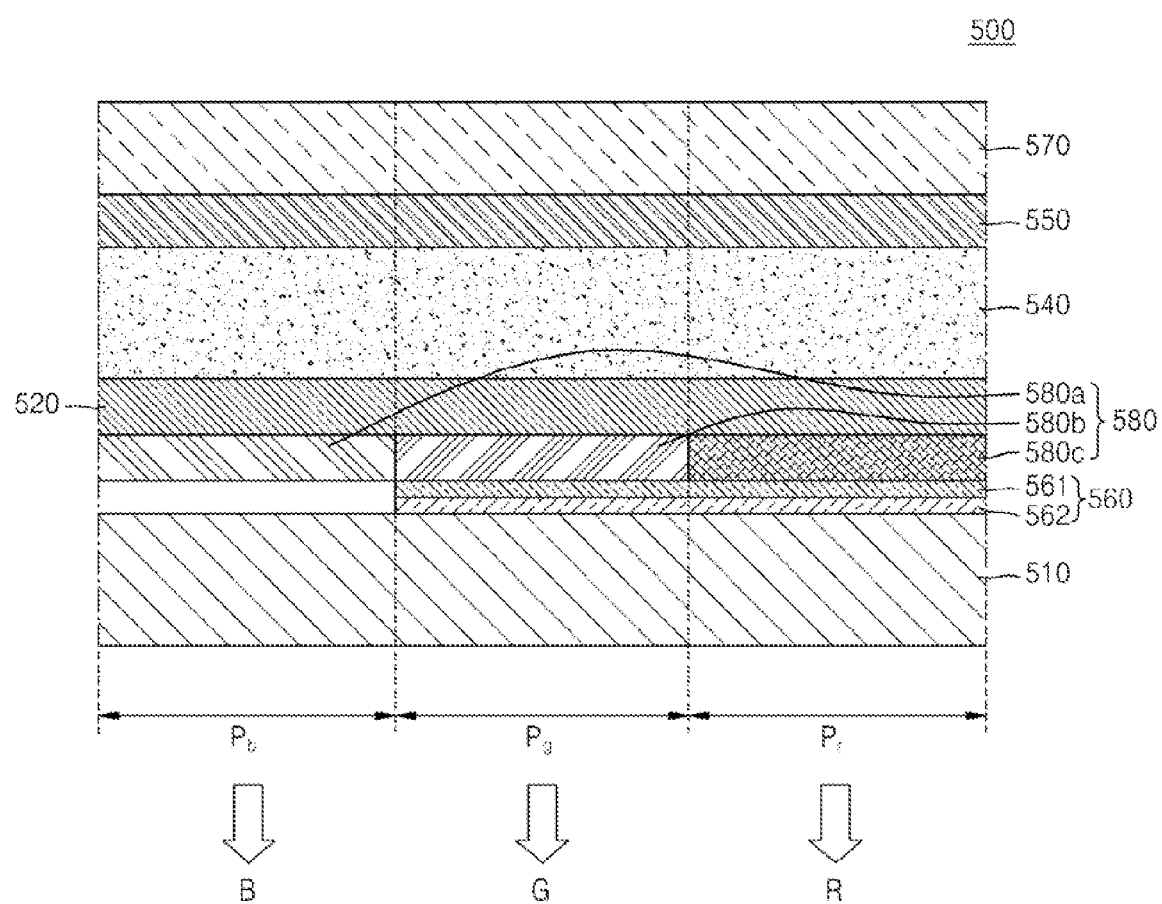
FIG. 13 illustrates a schematic sectional view of a display apparatus according to another embodiment.

FIG. 13 illustrates a schematic sectional view of a display apparatus 500 according to another embodiment.

Referring to FIG. 13, the display apparatus 500 according to the present embodiment may include a substrate 510 that is divided into or defines a first sub-pixel area Pb, a second sub-pixel area Pg, and a third sub-pixel area Pr at which a blue light, a green light, and a red light are emitted, respectively. The display apparatus 500 may further include a pixel electrode 520, an intermediate layer 540 (that includes a plurality of quantum dots and emits light), and an opposite electrode 550, that are sequentially stacked on the substrate 510.

The pixel electrode 520 may be a transparent or translucent electrode, and the opposite electrode 450 may be a reflective electrode.

For example, the display apparatus 500 according to the present embodiment may be a bottom emission type in which a light is emitted toward the pixel electrode 520.

The intermediate layer 540 may include a plurality of quantum dots (Qb in FIG. 12) that emit a blue light, a plurality of quantum dots (Qg in FIG. 12) that emit a green light, and a plurality of quantum dots (Qr in FIG. 12) that emit a red light. In addition to a quantum dot layer, the intermediate layer 540 may further include at least one of an HIL, an HTL, an ETL, or an EIL. The quantum dots Qb, Qg, and Qr may be formed of the same material and may have different sizes, according to the wavelength of an emitted light. In addition, the quantum dots Qb, Qg, and Qr may not include a toxic heavy metal, e.g., cadmium (Cd).

The display apparatus 500 according to the present embodiment may emit light when excitons drop from an excited state to a ground state. The excitons may be generated by combining holes injected from the pixel electrode 520 and electrons injected from the opposite electrode 550 in a quantum dot layer including the quantum dots Qb, Qg, and Qr. For example, the intermediate layer 540 may emit a white light.

A color filter 580 (for reproducing a color) may be included on a surface of the pixel electrode 520 through which light is emitted. The color filter 580 may include a first region 580a overlying the first sub-pixel area Pb and transmitting a blue light, a second region 580b overlying the second sub-pixel area Pg and transmitting a green light, and a third region 580c overlying the third sub-pixel area Pr and transmitting a red light.

A band pass filter 560 may be on regions of a surface of the color filter 580 through which light is emitted and corresponding to or overlying the second sub-pixel area Pg and the third sub-pixel area Pr, e.g., on the second region 580b and the third region 580c of the color filter 580.

The band pass filter 560 according to the present embodiment may be arranged to be common to, e.g., may continuously overlie, the second sub-pixel area Pg and the third sub-pixel area Pr. The band pass filter 560 may include an LWPF 561 and an SWPF 562. The band pass filter 560 may reflect or absorb portions of a green light and a red light emitted from the intermediate layer 540 to decrease the FWHM of the green light and the red light that are or end up being externally emitted, thereby enhancing the color purity of the display apparatus 500.

In an implementation, the color filter 580 and the band pass filter 560 may be between the substrate 510 and the pixel electrode 520. In an implementation, the color filter 580 and the band pass filter 560 may also be on an outer surface of the substrate 510.

The quantum dot light-emitting device and the display apparatus according to the embodiments may have a narrow FWHM and high luminance efficiency because or even though, e.g., cadmium (Cd), is not used. Thus, the quantum dot light-emitting device and the display apparatus may be environmentally friendly.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A quantum dot light-emitting device, comprising:
   a light-emitting device that emits a first light;
   a quantum dot layer facing the light-emitting device, the quantum dot layer:
     including a plurality of quantum dots,
     absorbing the first light, and
     emitting a second light and a third light that have different wavelength ranges compared to the first light; and
   a band pass filter on the quantum dot layer, such that the quantum dot layer is between the light-emitting device and the band pass filter, the band pass filter cutting off a portion of the second light and a portion of the third light.

2. The quantum dot light-emitting device as claimed in claim 1, wherein the plurality of quantum dots includes:
   a plurality of first quantum dots that absorb the first light and emit the second light, and
   a plurality of second quantum dots that absorb the first light and emit the third light.

3. The quantum dot light-emitting device as claimed in claim 2, wherein the first quantum dots and the second quantum dots are formed of a same material and have different sizes.

4. The quantum dot light-emitting device as claimed in claim 1, wherein:
   the third light has a longer wavelength than the second light,
   the band pass filter cuts off light in a shortest wavelength region of the second light, and
   the band pass filter cuts off light in a longest wavelength region of the third light.

5. The quantum dot light-emitting device as claimed in claim 4, wherein:
   a peak wavelength of the second light that passes through the band pass filter is longer than a peak wavelength of the second light emitted from the quantum dot layer, and a peak wavelength of the third light that passes through the band pass filter is shorter than a peak wavelength of the third light emitted from the quantum dot layer.

6. The quantum dot light-emitting device as claimed in claim 1, wherein the band pass filter reflects at least a portion of the first light.

7. The quantum dot light-emitting device as claimed in claim 1, wherein the band pass filter includes a short wave pass filter (SWPF) and a long wave pass filter (LWPF).

8. The quantum dot light-emitting device as claimed in claim 7, wherein:
a cutoff wavelength of the SWPF is shorter than or equal to about 655 nm, and
a cutoff wavelength of the LWPF is longer than or equal to about 500 nm.

9. The quantum dot light-emitting device as claimed in claim 1, wherein the quantum dots do not include cadmium or mercury.

10. A display apparatus, comprising:
a backlight unit; and
a display panel that receives light from the backlight unit and displays an image, the display panel including a first substrate, a second substrate, and a liquid crystal layer between the first substrate and the second substrate,
wherein the backlight unit includes a first region from which a first light is emitted, and a second region from which a second light and a third light are emitted, the second region including:
a light-emitting device that emits a first light;
a quantum dot layer facing the light-emitting device, the quantum dot layer:
including a plurality of quantum dots,
absorbing the first light, and
emitting the second light and the third light that have different wavelength ranges compared to the first light; and
a band pass filter on the quantum dot layer, such that the quantum dot layer is between the light-emitting device and the band pass filter, the band pass filter cutting off a portion of the second light and a portion of the third light.

11. The display apparatus as claimed in claim 10, wherein the first and second regions of the backlight are adjacent to one corner of the display panel.

12. The display apparatus as claimed in claim 10, wherein the backlight unit includes:
a first light guide that transmits the first light from the first region toward the display panel, and
a second light guide that transmits the second light and the third light toward the display panel after having passed through the band pass filter.

13. The display apparatus as claimed in claim 10, wherein the display panel further includes a color filter therein, the color filter reproducing a color.

14. The display apparatus as claimed in claim 10, wherein the plurality of quantum dots includes:
a plurality of first quantum dots that absorb the first light and emit the second light, and
a plurality of second quantum dots that absorb the first light and emit the third light.

15. The display apparatus as claimed in claim 10, wherein:
the third light has a longer wavelength than the second light,
the band pass filter cuts off light in a shortest wavelength region of the second light, and
the band pass filter cuts off light in a longest wavelength region of the third light.

16. The display apparatus as claimed in claim 10, wherein the band pass filter reflects at least a portion of the first light.

17. A display apparatus, comprising:
a substrate, the substrate being divided to define a first sub-pixel area for emitting a blue light, a second sub-pixel area for emitting a green light, and a third sub-pixel area for emitting a red light;
a pixel electrode on the substrate;
an opposite electrode facing the pixel electrode;
an intermediate layer between the pixel electrode and the opposite electrode, the intermediate layer including a plurality of quantum dots and emitting light; and
a band pass filter on one of the pixel electrode and the opposite electrode, the one of the pixel electrode and the opposite electrode being adjacent to a side of the apparatus at which light is emitted,
wherein the band pass filter:
overlies the second sub-pixel area and the third sub-pixel area, and
cuts off a portion of the green light and a portion of the red light.

18. The display apparatus as claimed in claim 17, wherein:
the pixel electrode includes a first pixel electrode, a second pixel electrode, and a third pixel electrode, the first pixel electrode overlying the first sub-pixel are, the second pixel electrode overlying the second sub-pixel area, and the third pixel electrode overlying third sub-pixel area,
the intermediate layer includes a first intermediate layer, a second intermediate layer, and a third intermediate layer, the first intermediate layer overlying the first sub-pixel area and including a plurality of quantum dots that emit the blue light, the second intermediate layer overlying the second sub-pixel area and including a plurality of quantum dots that emit the green light, and the third intermediate layer overlying third sub-pixel area and including a plurality of quantum dots that emit the red light,
the first sub-pixel area includes a first light-emitting device on the substrate, the first light-emitting device including a sequential stack of the first pixel electrode, the first intermediate layer, and the opposite electrode,
the second sub-pixel area includes a second light-emitting device on the substrate, the second light-emitting device including a sequential stack of the second pixel electrode, the second intermediate layer, and the opposite electrode, and
the third sub-pixel area includes a third light-emitting device on the substrate, the third light-emitting device including a sequential stack of the third pixel electrode, the third intermediate layer, and the opposite electrode, the third pixel electrode.

19. The display apparatus as claimed in claim 17, further comprising a color filter on the one of the pixel electrode or the opposite electrode that is adjacent to a side of the apparatus at which light is emitted, the color filter including:
a first region overlying the first sub-pixel area and through which the blue light passes;
a second region overlying the second sub-pixel area and through which the green light passes; and
a third region overlying the third sub-pixel area and through which the red light passes;
wherein:
the intermediate layer includes a plurality of quantum dots that emit the blue light, a plurality of quantum dots that emit the green light, and a plurality of quantum dots that emit the red light, and the band pass filter overlies the second region and the third region of the color filter.

20. The display apparatus as claimed in claim 17, wherein the quantum dots that emit the blue light, the quantum dots that emit the green light, and the quantum dots that emit the red light include a same material as one another and have different sizes from one another.

21. The display apparatus as claimed in claim 17, wherein:
the band pass filter cuts off light in a shortest wavelength region of the green light, and
the band pass filter cuts off light in a longest wavelength region of the red light.

* * * * *